United States Patent
Suh (10) Patent No.: US 8,507,787 B2
(45) Date of Patent: Aug. 13, 2013

(54) SOLAR CELL HAVING A DISCONTINUOUSLY GRADED DOPING CONCENTRATION

(75) Inventor: Myoung Gyun Suh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 167 days.

(21) Appl. No.: 13/044,761

(22) Filed: Mar. 10, 2011

(65) Prior Publication Data

US 2012/0080082 A1    Apr. 5, 2012

(30) Foreign Application Priority Data

Oct. 4, 2010 (KR) .................. 10-2010-0096385

(51) Int. Cl.
*H01L 31/00* (2006.01)
*H01L 21/00* (2006.01)
*H01L 31/102* (2006.01)
*H01L 29/66* (2006.01)

(52) U.S. Cl.
USPC ........... 136/255; 136/256; 136/262; 136/261; 438/48; 257/185; 257/191

(58) Field of Classification Search
USPC .................. 136/243–265; 257/185, 191
See application file for complete search history.

(56) References Cited

U.S. PATENT DOCUMENTS

| | | | |
|---|---|---|---|
| 4,001,864 A | 1/1977 | Gibbons | |
| 4,665,277 A | 5/1987 | Sah et al. | |
| 5,159,424 A | 10/1992 | Morishita et al. | |
| 6,255,580 B1 * | 7/2001 | Karam et al. | 136/256 |
| 7,727,795 B2 | 6/2010 | Stan et al. | |
| 2007/0023082 A1 * | 2/2007 | Manivannan et al. | 136/258 |
| 2008/0295882 A1 * | 12/2008 | Stephens et al. | 136/244 |
| 2009/0272438 A1 * | 11/2009 | Cornfeld | 136/261 |

FOREIGN PATENT DOCUMENTS

| | | |
|---|---|---|
| EP | 494088 A1 * | 7/1992 |
| JP | 03-106079 | 5/1991 |
| JP | 08-204215 | 8/1996 |
| JP | 2000-299483 | 10/2000 |

* cited by examiner

*Primary Examiner* — Jeffrey T Barton
*Assistant Examiner* — Eric R Smith
(74) *Attorney, Agent, or Firm* — Cantor Colburn LLP (57) ABSTRACT

A solar cell includes a base layer; an emitter layer disposed on one side of the base layer; a first electrode in electrical communication with the base layer; and a second electrode in electrical communication with the emitter layer, wherein the base layer has a higher doping concentration with increasing distance from the interface between the base layer and the emitter layer, and the base layer has a doping concentration change slope that is further decreased with increasing distance from the interface between the base layer and the emitter layer.

15 Claims, 10 Drawing Sheets

FIG. 10

SOLAR CELL HAVING A DISCONTINUOUSLY GRADED DOPING CONCENTRATION

CROSS-REFERENCE TO RELATED APPLICATION

This application claims priority to Korean Patent Application No. 10-2010-0096385, filed on Oct. 4, 2010, and all the benefits accruing therefrom under 35 U.S.C. §119, the content of which in its entirety is herein incorporated by reference.

BACKGROUND

1. Field

This disclosure relates to a solar cell.

2. Description of the Related Art

A solar cell transforms solar energy into electrical energy. Solar cells are diodes formed of PN junctions. They are divided into a variety of different kinds according to a material used in a light absorption layer.

Solar cells may be divided into a silicon solar cell, which includes silicon as a photoactive layer, a compound thin film solar cell including CIGS ($CuInGaSe_2$), CIS ($CuInSe_2$), or CGS ($CuGaSe_2$) as a photoactive layer, a Group III-V solar cell, a dye-sensitive solar cell, an organic solar cell, and the like.

Currently, much research is being conducted into the improvement of the efficiency of solar cells.

SUMMARY

One aspect of this disclosure provides a solar cell having an excellent short circuit current (Jsc), an excellent open circuit voltage (Voc), and an excellent photoelectric conversion efficiency.

According to one aspect of this disclosure, a solar cell includes: a base layer; an emitter layer disposed on one side of the base layer; a first electrode in electrical communication with the base layer; and a second electrode in electrical communication with the emitter layer, wherein the base layer has a doping concentration that is increases with increasing distance from the interface between the base layer and the emitter layer, and the base layer has a doping concentration change slope that decreases with increasing distance from the interface between the base layer and the emitter layer.

The base layer may have a thickness of about 100 nanometers (nm) to about 200 micrometers ("µm"), and the emitter layer may have a thickness of about 10 nm to about 1 µm.

The base layer may have a constant doping concentration from the interface between the base layer and the emitter layer until a thickness of about 2/5 (40%) of the entire base layer, when measured from the interface between the base layer and the emitter layer.

In one embodiment, the doping concentration of the base layer may be continuously changed.

On the other hand, the doping concentration of base layer may be discontinuously changed. In this case, the base layer has a distinguishable plurality of doping levels, and the thickness of each doping level having a constant doping concentration may be shorter than the diffusion length of a minority carrier. In addition, the doping thickness of each doping level of the base layer may become thinner with the increase in distance from the interface between the base layer and the emitter layer.

The base layer may have a doping concentration of about $1 \times 10^{15}$ $cm^{-3}$ to about $1 \times 10^{19}$ $cm^{-3}$.

The emitter layer may have a doping concentration of about $1 \times 10^{17}$ $cm^{-3}$ to about $1 \times 10^{20}$ $cm^{-3}$.

The solar cell may further include an auxiliary layer between the base layer and the emitter layer.

The auxiliary layer may have a doping concentration that is less than the doping concentration of the base layer as well as the doping concentration of the emitter layer, for example, the auxiliary layer may have a doping concentration of about $1 \times 10^{10}$ $cm^{-3}$ to about $1 \times 10^{16}$ $cm^{-3}$.

The auxiliary layer may have a thickness of about 10 nm to about 200 nm.

The solar cell may be a Group III-V solar cell. In addition, the solar cell may be a multijunction solar cell.

Other aspects of this disclosure will be described in the following detailed description.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. The solar cell according to one embodiment includes a base layer, an emitter layer disposed on one side of the base layer, a first electrode in electrical communication with the base layer, and a second electrode in electrical communication with the emitter layer. Herein, the doping concentration of the base layer is increased with increasing distance from the interface of the base layer and the emitter layer, and the doping concentration change slope of the base layer is decreased with increasing distance from the interface of the base layer and the emitter layer.

By increasing the doping concentration in the base layer to be maximum at the greatest distance from the interface between the base layer and the emitter layer, there is an increase the open circuit voltage (Voc) of the solar cell. In addition, the base layer provides an electric field similar to the electric field formed at the interface of the base layer and the emitter layer. This electric field facilitates electron-hole separation in the base layer and also facilitates the transfer of a separated minority carrier, such as for example, an electron, into the emitter layer in one direction. This electric field therefore enhances the short circuit current (Jsc) of the solar cell. As a result, the solar cell has excellent photoelectric conversion efficiency.

In addition, increasing the doping concentration in the base layer to be at maximum value at the greatest distance from the interface between the base layer and the emitter layer, relatively increases the electric field strength formed at the interface of the base layer and the emitter layer by relatively increasing the doping concentration change slope of the base layer region at the interface of the base layer and the emitter layer. As a result, the electron-hole pair may be effectively separated in the base layer at the interface of the base layer and the emitter layer. This improves the short circuit current (Jsc) and the photoelectric conversion efficiency of the solar cell.

Hereinafter, one embodiment of the solar cell 100 is described in detail referring to FIG. 1.

Figure 1:
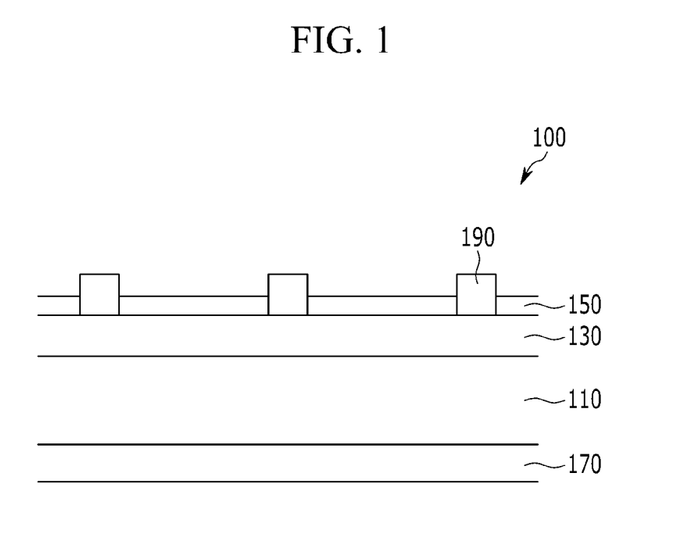
FIG. 1 is an exemplary cross-sectional view of a solar cell according to one embodiment of the present invention.

FIG. 1 is an exemplary cross-sectional view of a solar cell 100 according to one embodiment of the present invention.

As used hereinafter, the term "front side" refers to a side of the base layer which may be oriented towards a source of electromagnetic radiation, and the term "rear side" refers to the side that is opposed to the front side. Hereinafter, for better understanding and ease of description, the upper and lower positional relationships may be described relative to a center of the base layer, but is not limited thereto.

The solar cell 100 according to one embodiment of the present invention includes a base layer 110.

The base layer 110 may include a Group IV element such as silicon (Si), germanium (Ge), and the like; a Group III-V compound such as GaAs, InGaAs, GaInP, AlGaAs, InGaAsN, GaN, InGaN, GaP, and the like, or a combination thereof, but is not limited thereto. Specifically, the base layer 110 may include a Group III-V compound such as GaAs, InGaAs, GaInP, AlGaAs, InGaAsN, GaN, InGaN, GaP, and the like, or a combination thereof.

In FIG. 1, although the base layer 110 is a semiconductor layer doped with a p-type impurity, it may also be a semiconductor layer doped with an n-type impurity. The p-type impurity may include a Group III element such as boron (B), aluminum (Al), and the like; a Group IIb element such as zinc (Zn), cadmium (Cd), and the like; a Group IV element such as carbon (C); or a combination comprising a Group III element, a Group IIb element and a Group IV element. The n-type impurity may include a Group V element such as phosphorus (P); a Group IV element such as silicon (Si); a Group VI element such as selenium (Se), tellurium (Te), and the like; or a combination comprising a Group V element, a Group IV element and a Group VI element. Kinds of the p-type impurity and the n-type impurity may be selected depending on the material of the base layer 110.

When the base layer 110 is a semiconductor layer doped with a p-type impurity, the separated holes may be effectively collected at an electrode. On the other hand, when the base layer 110 is a semiconductor layer doped with an n-type impurity, the separated electrons may be effectively collected at an electrode.

The base layer 110 may have a thickness of about 100 nm to about 200 μm, specifically about 200 nm to about 100 μm, and more specifically about 300 nm to about 50 μm, depending upon the absorption coefficient of the material thereof. When the base layer 110 has a thickness within the aforementioned range, it may absorb almost all the solar light having the wavelength band that the material may adsorb. For example, the base layer 110 may have a thickness of about 500 nm to about 5 μm.

The doping profile of the base layer 110 is described as follows. The base layer may have a doping concentration of about $1 \times 10^{15}$ cm$^{-3}$ to about $1 \times 10^{19}$ cm$^{-3}$.

An emitter layer 130 is formed on the front surface of the base layer 110.

The emitter layer 130 may include a Group IV element such as silicon (Si), germanium (Ge), and the like, or a combination thereof; a Group III-V compound such as GaAs, InGaAs, GaInP, AlGaAs, InGaAsN, GaN, InGaN, GaP, and the like; or a combination thereof, but is not limited thereto.

In FIG. 1, although the emitter layer 130 is a semiconductor layer doped with an n-type impurity, it may be a semiconductor layer doped with a p-type impurity. The p-type impurity and n-type impurity are as described above. The p-type impurity and the n-type impurity may be selected depending on the material of the emitter layer 130.

When the emitter layer 130 is a semiconductor layer doped with an n-type impurity, the separated electrons may be effectively collected at an electrode. When the emitter layer 130 is a semiconductor layer doped with p-type impurity, the separated holes may be effectively collected at an electrode.

The emitter layer 130 may have a thickness of about 10 nm to about 1 μm, specifically about 20 nm to about 0.75 μm, and more specifically about 30 nm to about 0.5 μm, but is not limited thereto.

The emitter layer 130 may have a doping concentration of about $1 \times 10^{17}$ cm$^{-3}$ to about $1 \times 10^{20}$ cm$^{-3}$. When the emitter layer 130 has a doping concentration within the range, it may increase the short circuit current (Jsc). For example, the emitter layer 130 may have a doping concentration of about $1 \times 10^{18}$ cm$^{-3}$ to about $1 \times 10^{19}$ cm$^{-3}$.

A plurality of front electrodes 190 are separated from each other and are disposed on the front surface of emitter layer 130. The front electrodes are in electrical communication with the emitter layer 130. For example, a plurality of front electrodes 190 may be formed by screen printing, inkjet printing, press printing or using a method comprising the foregoing methods of printing a material having excellent conductivity such as silver (Ag), gold (Au), or the like, on the front surface of the emitter layer 130.

Although not shown in the FIG. 1, before disposing or forming the plurality of front electrodes 190, a window layer and a contact layer may be optionally sequentially disposed on the front surface of the emitter layer 130. The window layer may include, for example, a transparent conductive material such as InGaP, AlInP, or AlGaAs doped with an n-type impurity, but is not limited thereto. Transparent intrinsically conductive polymers such as polyaniline, polypyrrole, polythiophene, polyacetylene may also be used to form the window layer. The n-type impurity is the same as described above.

The window layer prevents the recombination of electron-hole pairs in the surface of the emitter layer, so as to prevent or alleviate deterioration of the short circuit current (Jsc).

The window layer may have a thickness of about 10 nm to about 500 nm, or for example, a thickness of about 20 nm to about 100 nm.

The contact layer may include, for example, a conductive material such as GaAs or InGaAs, but is not limited thereto. The contact layer may also include the intrinsically conductive polymers listed above.

The contact layer may play a role of reducing the contact resistance between the front electrode and the semiconductor layer. The contact layer may also be doped with an impurity. In one embodiment, when the base layer is doped with a p-type impurity, the contact layer is doped with an n-type impurity. In another embodiment, when the base layer is doped with a n-type impurity, the contact layer is doped with a p-type impurity. The contact layer may have a thickness of about 50 nm to about 1 μm, or for example, a thickness of about 200 nm to about 500 nm.

After forming the plurality of front electrodes 190 on the contact layer, the contact layer may be etched to remove the region where the plurality of front electrodes 190 are not disposed.

Referring to FIG. 1, an optional anti-reflection coating 150 may be disposed on the front surface of the emitter 130 at positions where the plurality of front electrodes 190 are not present. The anti-reflection coating 150 may be made of an insulating material that reflects little light. For example, it may be an oxide such as aluminum oxide ($Al_2O_3$), silicon oxide ($SiO_2$), titanium oxide ($TiO_2$ or $TiO_4$), magnesium oxide (MgO), cerium oxide ($CeO_2$), or a combination thereof, a nitride such as aluminum nitride (AlN), silicon nitride ($SiN_x$), titanium nitride (TiN), or a combination thereof, or an oxynitride such as aluminum oxynitride (AlON), silicon oxynitride (SiON), titanium oxynitride (TiON), or a combination thereof. It may be disposed in the form of a single layer or as a plurality of layers.

The anti-reflection coating 150 may be disposed by subjecting the front surface of the emitter layer 130 to screen printing, inkjet printing, press printing, or a combination thereof, with, for example, silicon nitride, but is not limited thereto.

The anti-reflection coating 150 may have a thickness of about 50 nm to about 300 nm, or for example, a thickness of about 80 nm to about 150 nm.

The anti-reflection coating 150 is disposed on the front surface of the base layer 110, and decreases the reflectance of light on the surface of the solar cell. The anti-reflection coating also increases the selectivity of a predetermined wavelength region.

A rear electrode 170 is disposed on the rear part of the base layer 110. The rear electrode 170 may be formed of an opaque metal such as aluminum (Al), and may have a thickness of about 1 μm to about 100 μm, or for example, a thickness of about 1 μm to about 10 μm.

The rear electrode 170 may prevent light loss by reflecting light that has been transmitted through the base layer 110. This reflection of light by the rear electrode 170 may improve the efficiency of the solar cell.

Hereinafter, the doping profile of the base layer 110 is described in detail.

The base layer 110 has an increased doping concentration with increasing distance from the interface of the base layer 110 and the emitter layer 130, for example, the p-n junction part. The effects thereof are the same as described above.

The doping concentration change slope of the base layer 110 is decreased with increasing distance from the interface between the base layer 110 and the emitter layer 130. This may relatively increase the electric field intensity formed on the front side of the base layer 110 by relatively increasing the doping concentration change slope on the front side of the base layer 110. As a result, it may effectively separate the electron-hole pairs on the front side of the base layer 110, so as to improve the short circuit current (Jsc) and photoelectric conversion efficiency of the solar cell. In addition, more light is absorbed nearer to the front surface of the solar cell 100 and less light is absorbed farther from the front surface of the solar cell 100. Referring to this, it is clear that the solar cell 100 including the base layer 110 has an excellent short circuit current (Jsc) and photoelectric conversion efficiency.

The doping concentration of the base layer 110 may remain constant until about 2/5 (40%) of the thickness of the entire base layer from the interface between the base layer 110 and the emitter layer 130. Because of the constant doping until about 2/5 (40%) of the thickness of the entire base layer, a stronger electric field may be formed in the region farther from the p-n junction part. As a result larger numbers of the electron-hole pairs are recombined. As a result there is an improvement in the short circuit current (Jsc) of the solar cell when compared with other solar cells that do not have the constant doping until about 2/5 (40%) of the thickness of the entire base layer.

In one embodiment, the doping concentration of the base layer 110 may be continuously changed. A solar cell wherein the base layer has a continuous change in the doping concentration may be processed more easily when compared with other profiles for the doping concentration. Changing the doping concentration in the base layer in a continuous fashion may facilitate the separation of electron-hole pairs by providing the electric field to all regions.

In another embodiment, the doping concentration of the base layer 110 may be discontinuously changed. In this case, each electron-hole pair is effectively separated by providing a strong electric field in a certain region of the discontinuous doping profile.

When the doping concentration of the base layer 110 is discontinuously changed, the base layer 110 may have a distinguishable plurality of doping levels.

When the doping concentration of the base layer 110 is discontinuously changed, the thickness of each distinguishable doping level is smaller than the diffusion length of the minority carrier. In one embodiment, the thickness of each distinguishable doping level is smaller than the electron diffusion length. In this case, the separated minority carrier may be effectively transferred to the adjacent doping level without undergoing recombination. Thereby, it may improve the photoelectric conversion efficiency of the solar cell including the base layer 110.

The doping thickness on each distinguishable doping level may be thinner as distance increases from the interface of the base layer 110 and the emitter layer 130. In this case, even if the electric field formed in the base layer 110 is further decreased with increasing distance from the interface of the base layer 110 and the emitter layer 130, the electron-hole pairs may be easily separated in the base layer 110, and the separated minority carrier may be effectively transferred to the adjacent doping level without undergoing recombination. Thereby, it may improve the photoelectric conversion efficiency of the solar cell including the base layer 110.

The base layer 110 may have a doping concentration of about $1 \times 10^{15}$ cm$^{-3}$ to about $1 \times 10^{19}$ cm$^{-3}$. When the base layer 110 has a doping concentration within this range, the short circuit current (Jsc) may be enhanced. For example, the base layer 110 may have a doping concentration of about $1 \times 10^{16}$ cm$^{-3}$ to about $5 \times 10^{17}$ cm$^{-3}$.

Hereinafter, a solar cell 200 according to one embodiment is described with reference to FIG. 2.

Figure 2:
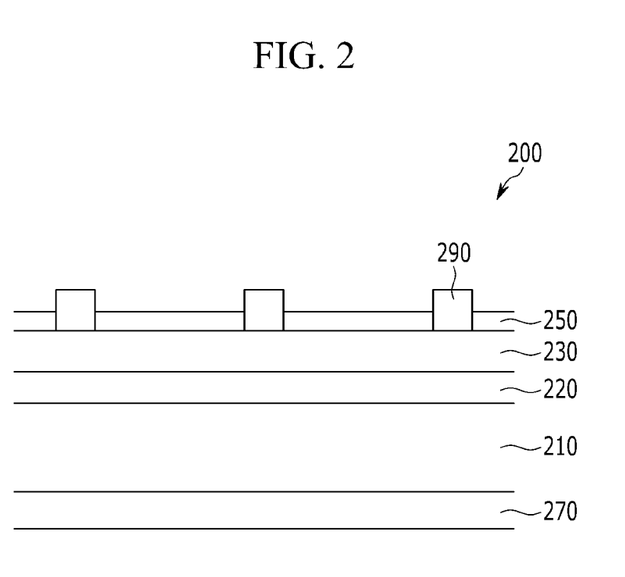
FIG. 2 is an exemplary cross-sectional view of a solar cell according to another embodiment of the present invention.

FIG. 2 is a cross-sectional view of a solar cell 200 according to another embodiment of the present invention.

The solar cell 200 according to one embodiment includes a base layer 210, an auxiliary layer 220 disposed on the front surface of the base layer 210, an emitter layer 230 disposed on the front surface of the auxiliary layer 220, a plurality of front electrodes 290 disposed on the front surface of the emitter layer 230, an anti-reflection coating 250 disposed on the front surface of emitter layer 230 but not on a region where the plurality of front electrodes 290 are disposed, and a rear electrode 270 disposed on the rear part of the base layer 210.

Although not shown in FIG. 2, before disposing the plurality of front electrodes 290, an optional window layer and an optional contact layer may be sequentially formed on the front surface of the emitter layer 230. Unless it is described otherwise, the base layer, the emitter layer, the front electrode, the anti-reflection coating, the rear electrode, the window layer, and the contact layer are the same as described above.

The auxiliary layer 220 may suppress the current leakage that may be generated by the impurity used for doping at the interface of the base layer 210 and the emitter layer 230, for example, in the p-n junction region. The electron-hole pairs may be easily separated by extending the length of the depletion region. In addition, the auxiliary layer 220 may suppress the current leakage generation even if the open circuit voltage (Voc) is increased under a high concentration condition by increasing the doping concentration of the base layer 210. As a result, the solar cell including the auxiliary layer 220 may have a high open circuit voltage (Voc) and a high fill factor (FF) while not increasing the resistance. In addition, it may also have a high short circuit current (Jsc).

The auxiliary layer 220 may include a Group IV element such as silicon (Si), germanium (Ge), and the like, or a combination thereof; a Group III-V compound such as GaAs, InGaAs, GaInP, AlGaAs, InGaAsN, GaN, InGaN, GaP, and the like; or a combination thereof, but is not limited thereto. Specifically, the auxiliary layer 220 may include a Group III-V compound such as GaAs, InGaAs, GaInP, AlGaAs, InGaAsN, GaN, InGaN, GaP, and the like. Combination of Group IV elements, Group III-V elements and Group III-V elements may also be used.

In one embodiment, the auxiliary layer 220 may have a lesser doping concentration than the doping concentration of the base layer 210 and the doping concentration of the emitter layer 230. For example, the auxiliary layer 220 may have a doping concentration of about $1 \times 10^{10}$ cm$^{-3}$ to about $1 \times 10^{16}$ cm$^{-3}$. It may be doped with a p-type impurity or may be doped with an n-type impurity. The p-type impurity and the n-type impurity are the same as those described above. When the auxiliary layer 220 has a doping concentration within the aforementioned range, the base layer 210 may effectively suppress the current leakage that may be generated by the impurity used for the doping on the interface between the base layer and the emitter layer. In one exemplary embodiment, in the p-n junction region, even if the open circuit voltage (Voc) is increased under the high concentration condition by increasing the doping concentration of the base layer 210, the solar cell may have a high open circuit voltage (Voc) and a high fill factor (FF), as well as a high short circuit current (Jsc). In one embodiment, for example, the auxiliary layer 220 may have a doping concentration of about $1\times10^{13}$ cm$^{-3}$ to about $1\times10^{15}$ cm$^{-3}$.

The auxiliary layer 220 may have a thickness of about 10 nm to about 200 nm. In one embodiment, the auxiliary layer may have a thickness of about 20 nm to about 100 nm.

When the auxiliary layer 220 has a thickness within the range, it may effectively suppress the current leakage that may be generated by the impurity used for doping in the interface of the base layer 210 and the emitter layer 230. In one embodiment, by maintaining the auxiliary layer to the aforementioned thickness, there is an increase in the resistance while increasing the open circuit voltage (Voc), the fill factor (FF), and the short circuit current (Jsc) of the solar cell. In FIG. 1 and FIG. 2, a solar cell including one base layer and one emitter layer is illustrated in exemplary embodiments, but it is not limited thereto. The solar cell according to one embodiment may be a multijunction solar cell including a plurality of base layers and emitter layers. In this case, at least one of the plurality of base layers included in the multijunction solar cell may have the doping profile detailed above.

Hereinafter, the doping profile of a solar cell according to one embodiment and an energy band diagram thereof are exemplified in detail with reference to the drawings.

Figure 3:
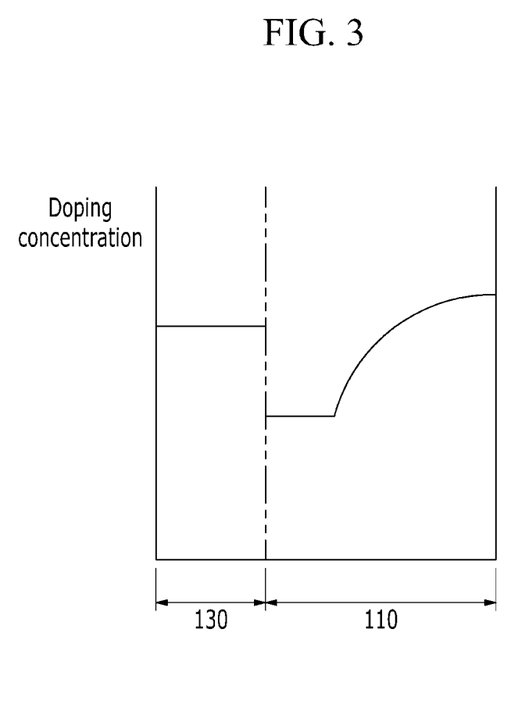
FIG. 3 shows a doping profile of a solar cell according to one embodiment of the present invention.
Figure 4:
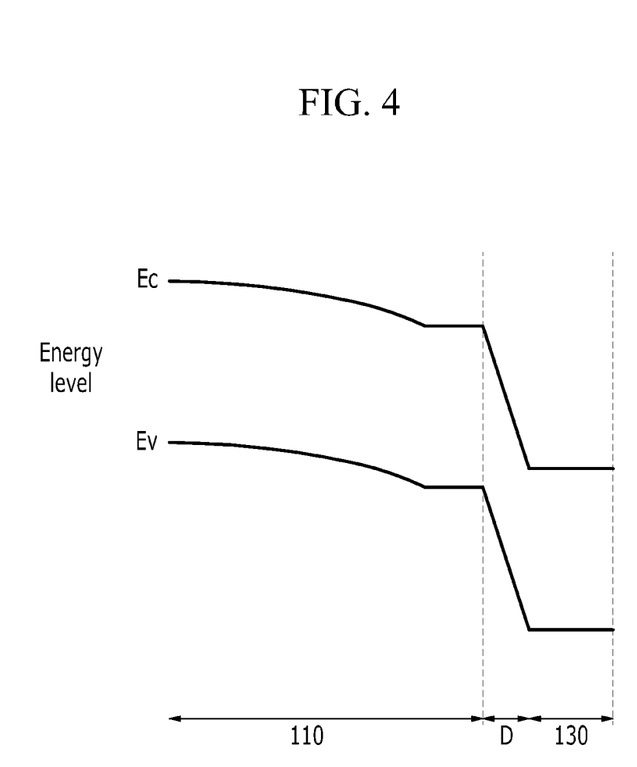
FIG. 4 is a band diagram of the solar cell shown in FIG. 3.

First, referring to FIG. 3 and FIG. 4, the solar cell according to one embodiment is described.

FIG. 3 shows a doping profile of a solar cell according to one embodiment of the present invention. In addition, FIG. 4 shows the energy band diagram of the solar cell shown in FIG. 3.

As shown in FIG. 3, the solar cell according to one embodiment includes a base layer 110 having a continuously changing doping profile with an increasing doping concentration with increasing distance from the interface between the base layer 110 and the emitter layer 130.

In addition, as shown in FIG. 4, the solar cell according to one embodiment includes a base layer 110 having a conductive band (CB) (Ec) and a valence band (VB) (Ev) in which energy is further increased and continuously changed with increasing distance from the depletion region (D).

The base layer 110 of the solar cell according to one embodiment provides the sloped energy band and electric field, so the solar cell according to one embodiment may separate the electron-hole pair not only in the depletion region (D) but also in the base layer 110. As a result, the solar cell according to one embodiment of the present invention may have an excellent short circuit current (Jsc) and excellent photoelectric conversion efficiency.

In addition, the solar cell according to one embodiment may increase the energy band level of the base layer 110 by increasing the doping concentration of the farthest part of the base layer 110 from the interface between the base layer 110 and the emitter layer 130. As a result, the solar cell including the base layer 110 may increase the open circuit voltage (Voc) under a high concentration condition by increasing the band energy difference between the base layer 110 and the emitter layer 130. Accordingly, the solar cell according to one embodiment may have an excellent open circuit voltage (Voc) even under the high concentration condition.

Figure 5:
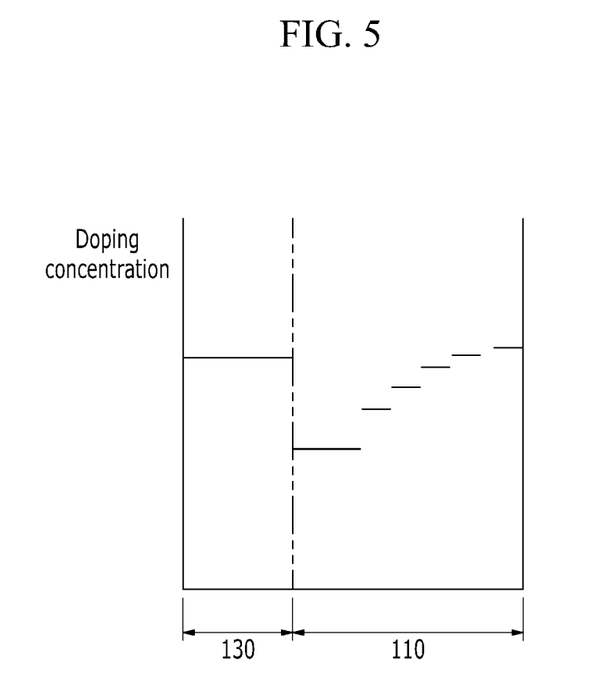
FIG. 5 shows a doping profile of a solar cell according to one embodiment of the present invention.
Figure 6:
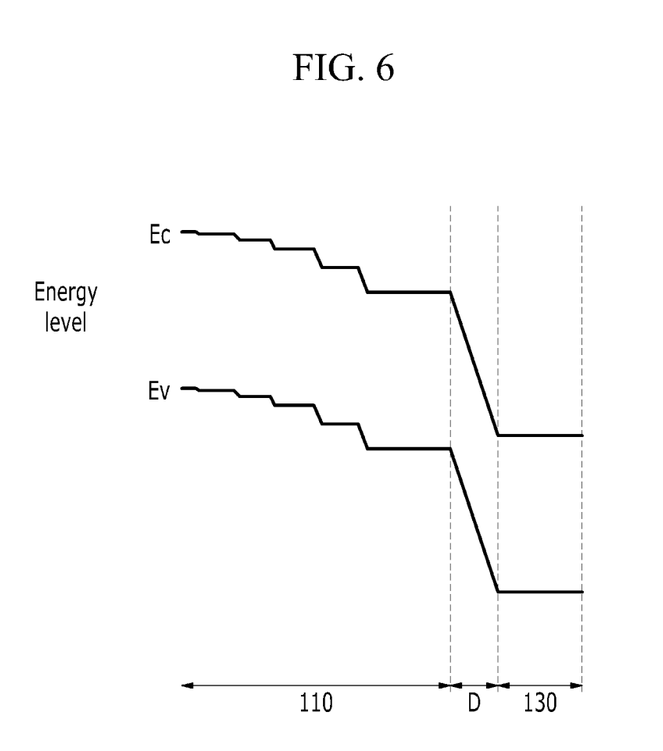
FIG. 6 is an energy band diagram of the solar cell shown in FIG. 5.

Referring to FIGS. 5 and 6, a solar cell according to one embodiment of the present invention is described.

FIG. 5 shows a doping profile of a solar cell according to one embodiment of the present invention. In addition, FIG. 6 is the energy band diagram of the solar cell shown in FIG. 5.

As shown in FIG. 5, the solar cell according to one embodiment of the present invention includes a base layer 110 having a discontinuously changing doping profile in which the doping concentration is increased with increasing distance from the interface between the base layer and the emitter layer.

In addition, as shown in FIG. 6, the solar cell according to one embodiment of the present invention includes a base layer 110 having the conductive band (CB) and the valence band (VB) in which energy is further increased and discontinuously changed with increasing distance from the depletion region (D) that is disposed between the base layer 110 and the emitting layer 130.

The base layer 110 of the solar cell according to one embodiment forms an electric field by providing the energy band in a discontinuous slope, so it provides a strong electric field in a certain region. Accordingly, the electron-hole pair may be effectively separated not only in the depletion region (D) but also in the base layer 110. As a result, the solar cell according to one embodiment of the present invention may have an excellent short circuit current (Jsc) and excellent photoelectric conversion efficiency.

In addition, the solar cell according to one embodiment of the present invention may increase the energy band level of the base layer 110 by increasing the doping concentration of the base layer 110 region farthest from the interface between the base layer 110 and the emitter layer 130. As a result, it may increase the open circuit voltage (Voc) under the high concentration condition by increasing the differentiation of band energy of the base layer 110 and the emitter layer 130. Accordingly, the solar cell according to one embodiment may have an excellent open circuit voltage (Voc) under the high concentration condition.

Figure 7:
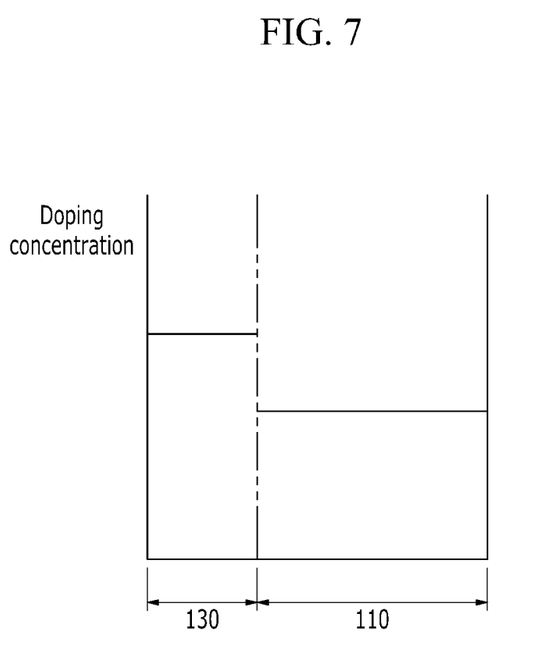
FIG. 7 is a doping profile of a solar cell including a base layer and an emitter layer having one flat doping level, respectively.
Figure 8:
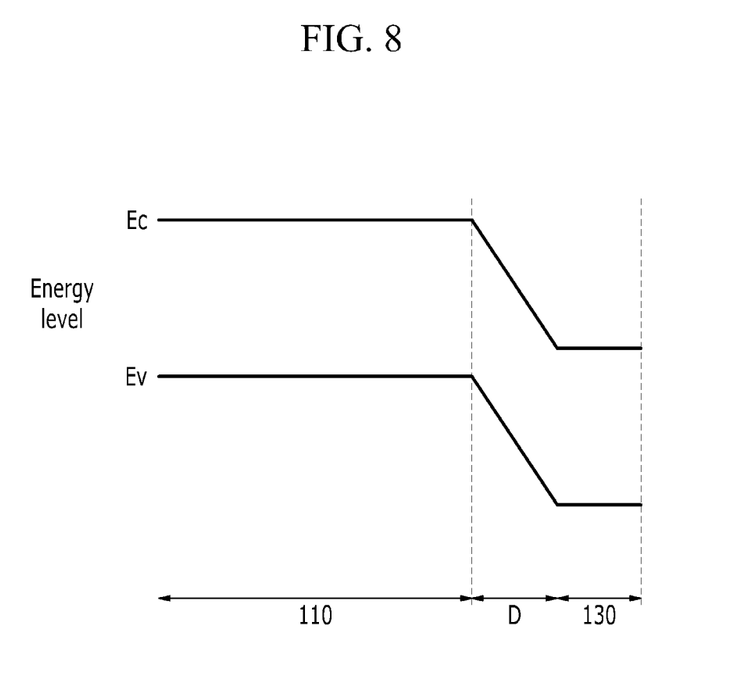
FIG. 8 is an energy band diagram of the solar cell shown in FIG. 7.
Figure 9:
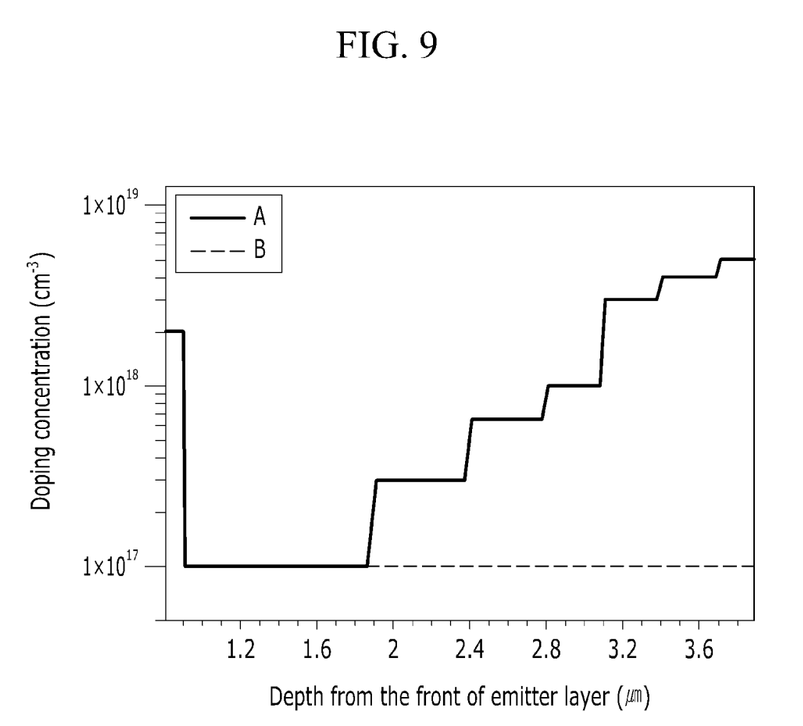
FIG. 9 is a doping profile of a solar cell according to one embodiment of the present invention and a solar cell including a base layer and an emitter layer having one flat doping level, respectively.
Figure 10:
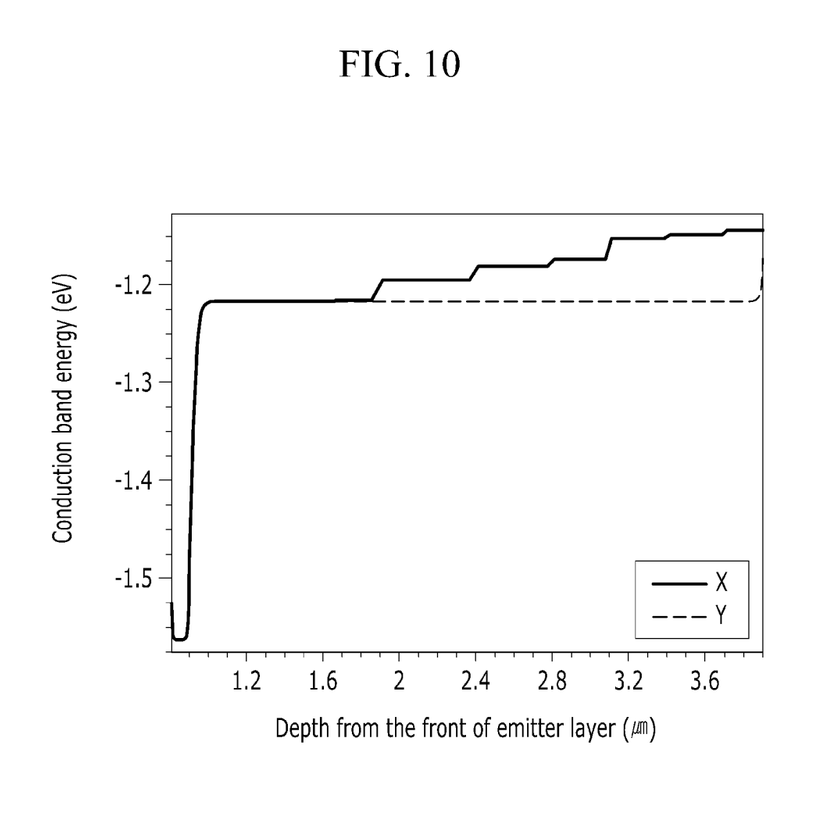
FIG. 10 is an energy band diagram of the solar cell shown in FIG. 9.

Line A of FIG. 9 is one example of a doping profile of a solar cell according to one embodiment of the present invention, and the energy band diagram is shown by line X of FIG. 10. The solar cell is a double junction solar cell including InGaP and InGaAs, and line A of FIG. 9 shows a doping profile of a junction including the InGaAs. The solar cell having the doping profile may have a short circuit current of about 14.63 mA/cm$^2$, an open circuit voltage of about 2.19 V, and photoelectric conversion efficiency of about 27.28%. Thereby, it is confirmed that the solar cell having the doping profile according to one embodiment of the present invention provides an excellent short circuit current, open voltage, and photoelectric conversion efficiency. On the other hand, FIG. 7 is a doping profile of a solar cell including a base layer 110 having only one flat doping level due to the constant doping concentration and an emitter layer 130 having only one flat doping level due to the constant doping concentration, and FIG. 8 is an energy band diagram of the solar cell.

As shown in FIG. 8, the solar cell including a base layer 110 and an emitter layer 130 having one flat doping level, respectively, includes a base layer 110 having one flat conductive band (CB) (Ec) due to the constant energy and only one flat valence band (VB) (Ev) due to the constant energy, and an emitter layer 130 having one flat conductive band (CB) (Ec) due to the constant energy and only one flat valence band (VB) (Ev) due to the constant energy. The solar cell does not form the electric field at a region other than the depletion region (D), so it does not accomplish the excellent short circuit current, open voltage, and photoelectric conversion efficiency as much as those of the solar cell according to one embodiment of the present invention.

Line B of FIG. 9 shows one example of the doping profile of the solar cell including a base layer and an emitter layer having one flat doping level, respectively, and line Y of FIG. 10 shows the energy band diagram thereof. The solar cell is a double junction solar cell including InGaP and InGaAs, and line B of FIG. 9 shows the doping profile of a junction including the InGaAs. The solar cell having the doping profile may have a short circuit current of about 14.23 milliamperes per square centimeter (mA/cm$^2$), an open circuit voltage of about 2.18 volt (V), and photoelectric conversion efficiency of about 26.53%. Thereby, it is confirmed that the solar cell including a base layer and an emitter layer having only one flat doping level, respectively, may not accomplish the excellent short circuit current, open circuit voltage, and photoelectric conversion efficiency as well as those of the solar cell according to one embodiment of the present invention.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar cell comprising:
   a base layer;
   an emitter layer disposed on one side of the base layer;
   a first electrode in electrical communication with the base layer; and
   a second electrode in electrical communication with the emitter layer,
   wherein the base layer has a higher doping concentration with increasing distance from an interface between the base layer and the emitter layer, and the base layer has a doping concentration change slope that is decreased with increasing distance from the interface between the base layer and the emitter layer;
   wherein the doping concentration of the base layer is discontinuously changed,
   wherein the base layer has a distinguishable plurality of doping levels, and a thickness having the constant doping concentration of each doping level which is smaller than a diffusion length of a minority carrier, and
   wherein the base layer has a distinguishable plurality of doping levels, and a doping thickness in each doping level becomes thinner with increasing distance from the interface between the base layer and the emitter layer.

2. The solar cell of claim 1, wherein the base layer has a thickness of about 100 nanometers to about 200 micrometers.

3. The solar cell of claim 1, wherein the base layer has a constant doping concentration up to ⅔ of entire base layer thickness from the interface between the base layer and the emitter layer.

4. The solar of claim 1, wherein the base layer has a doping concentration of about $1\times10^{15}$ cm$^{-3}$ to about $1\times10^{19}$ cm$^{-3}$.

5. The solar cell of claim 1, wherein the emitter layer has a thickness of about 10 nanometer to about 1 micrometer.

6. The solar cell of claim 1, wherein the emitter layer has a doping concentration of about $1\times10^{17}$ cm$^{-3}$ to about $1\times10^{20}$ cm$^{-3}$.

7. The solar cell of claim 1, further comprising an auxiliary layer disposed between the base layer and the emitter layer.

8. The solar cell of claim 7, wherein the auxiliary layer has a smaller doping concentration than a doping concentration of the base layer and a doping concentration of the emitter layer.

9. The solar cell of claim 7, wherein the auxiliary layer has a doping concentration of about $1\times10^{10}$ cm$^{-3}$ to about $1\times10^{16}$ cm$^{-3}$.

10. The solar cell of claim 7, wherein the auxiliary layer has a thickness of about 10 nanometer to about 200 nanometer.

11. The solar wherein the solar cell is a multijunction solar cell.

12. The solar cell of claim 1, further comprising a window layer and a contact layer sequentially disposed on a surface of the emitter layer.

13. A method comprising:
    disposing an emitter layer on one side of a base layer;
    electrically contacting a first electrode with the base layer; and
    electrically contacting a second electrode with the emitter layer,
    wherein the base layer has a higher doping concentration with increasing distance from an interface between the base layer and the emitter layer, and the base layer has a doping concentration change slope that is decreased with increasing distance from the interface between the base layer and the emitter layer; wherein the doping concentration of the base layer is discontinuously changed,
    wherein the base layer has a distinguishable plurality of doping levels, and a thickness having the constant doping concentration of each doping level which is smaller than a diffusion length of a minority carrier, and
    wherein the base layer has a distinguishable plurality of doping levels, and a doping thickness in each doping level becomes thinner with increasing distance from the interface between the base layer and the emitter layer.

14. The method of claim 13, further comprising disposing an auxiliary layer between the base layer and the emitter layer.

15. The method of claim 13, wherein the first electrode and/or the second electrode is formed by screen printing, inkjet printing, press printing or a combination comprising at least one of the foregoing methods of printing.

* * * * *